United States Patent
Chen et al.

(10) Patent No.: US 8,736,373 B2
(45) Date of Patent: *May 27, 2014

(54) OUTPUT BUFFER OF SOURCE DRIVER

(75) Inventors: Chien-Ming Chen, Tainan (TW); Yann-Hsiung Liang, Hsinchu (TW); Hui-Wen Miao, Hsinchu (TW); Ko-Yang Tso, New Taipei (TW)

(73) Assignee: Raydium Semiconductor Corporation, Hsinchu County (TW)

(*) Notice: Subject to any disclaimer, the term of this patent is extended or adjusted under 35 U.S.C. 154(b) by 64 days.

This patent is subject to a terminal disclaimer.

(21) Appl. No.: 13/435,340

(22) Filed: Mar. 30, 2012

(65) Prior Publication Data

US 2012/0249245 A1 Oct. 4, 2012

(30) Foreign Application Priority Data

Mar. 31, 2011 (TW) .............................. 100111233 A

(51) Int. Cl.
*H03F 3/45* (2006.01)
*G06F 3/038* (2013.01)

(52) U.S. Cl.
CPC .................................. *H03F 3/45183* (2013.01)
USPC ........................................... 330/259; 345/204

(58) Field of Classification Search
USPC ........................................... 330/259; 345/204
See application file for complete search history.

(56) References Cited

U.S. PATENT DOCUMENTS 7,567,244 B2 * 7/2009 Nohtomi et al. .............. 345/204

* cited by examiner

*Primary Examiner* — Robert Pascal
*Assistant Examiner* — Khiem Nguyen

(57) ABSTRACT

An output buffer of a source driver is disclosed. The output buffer includes a buffer input, a buffer output, a differential input stage, a bias current source, an output stage, a compensation capacitor, and a comparator. The output stage and the comparator are both operated between an analog supply voltage (AVDD) and a ground voltage (AGND). The comparator compares an input voltage and an output voltage and outputs a control signal to the bias current source according to the compared result to control a bias current outputted by the bias current source to enhance the slew rate of the output buffer.

9 Claims, 4 Drawing Sheets

OUTPUT BUFFER OF SOURCE DRIVER

BACKGROUND OF THE INVENTION

1. Field of the Invention

The invention relates to a liquid crystal display; in particular, to an output buffer applied in a source driver of a liquid crystal display.

2. Description of the Prior Art

In recent years, with the continuous progress of display technology, various types of display apparatuses, such as a LCD display and a plasma display, are shown in the market. Because the volume of the LCD display is much smaller the conventional CRT display, the LCD display using smaller desk space is convenient for the people in modern life.

In general, the driving apparatus of the TFT-LCD display mainly includes a source driving circuit and a gate driving circuit. For the TFT-LCD display having high quality, high resolution, and low power consumption, the source driving circuit plays a very important role. Please refer to FIG. 1. FIG. 1 illustrates a schematic diagram of a circuit structure of a conventional source driver.

As shown in FIG. 1, the source driver 1 includes a receiver 10, a data register 12, a bi-directional shift register 14, a line latch 16, a level shifter 18, a digital-to-analog converter 20, and an output buffer 22. The main power domain of the source driver 1 includes digital power sources VDD, VSS and analog power sources AVDD, AGND.

The output buffer 22 of the source driver 1 is usually realized by an operational amplifier (OPAMP). For the source driver 1 of the TFT-LCD display, its visual performance is determined by the operational amplifier, especially the slew rate which is important to the TFT-LCD display applied in the high frame rate application.

Please refer to FIG. 2. FIG. 2 illustrates a circuit diagram of a conventional operational amplifier OPAMP used as the output buffer 22. As shown in FIG. 2, the circuit of the operational amplifier OPAMP includes a differential input stage DIS, a bias current source $I_{BS}$, an output stage OS, and a compensation capacitor $C_c$. Because the operational amplifier OPAMP is operated under the analog power source, its input voltage $V_{in}$, output voltage $V_{out}$, and output stage OS will have operation voltages between AVDD and AGND.

For the operational amplifier OPAMP, the slew rate performance is determined by the bias current source $I_{BS}$/the compensation capacitor $C_c$. Therefore, if the bias current source $I_{BS}$ is increased or the compensation capacitor $C_c$ is decreased, the slew rate of the operational amplifier OPAMP can be effectively enhanced. However, the increasing of the bias current source $I_{BS}$ will consume more power and the decreasing of the compensation capacitor $C_c$ will cause poor stability. The more power consumption and poor stability will largely affect the normal operation of the entire system.

Therefore, the invention provides an output buffer applied in a source driver of a liquid crystal display to solve the above-mentioned problems occurred in the prior arts.

SUMMARY OF THE INVENTION

An embodiment of the invention is an output buffer applied in a source driver of a liquid crystal display. It uses the way of changing the input voltage to effectively increase the slew rate of the output buffer and solve the problems of large power consumption and poor stability in prior arts; therefore, the entire performance of the TFT-LCD can be enhanced.

In this embodiment, the output buffer includes a buffer input, a buffer output, a differential input stage, a bias current source, an output stage, a compensation capacitor, and a comparator. The output stage and the comparator are both operated between an analog supply voltage (AVDD) and a ground voltage (AGND). The comparator compares an input voltage and an output voltage and outputs a control signal to the bias current source according to the compared result.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

An embodiment of the invention is an output buffer. In this embodiment, the output buffer is applied in a source driver of a TFT-LCD display, but not limited to this.

Figure 1:
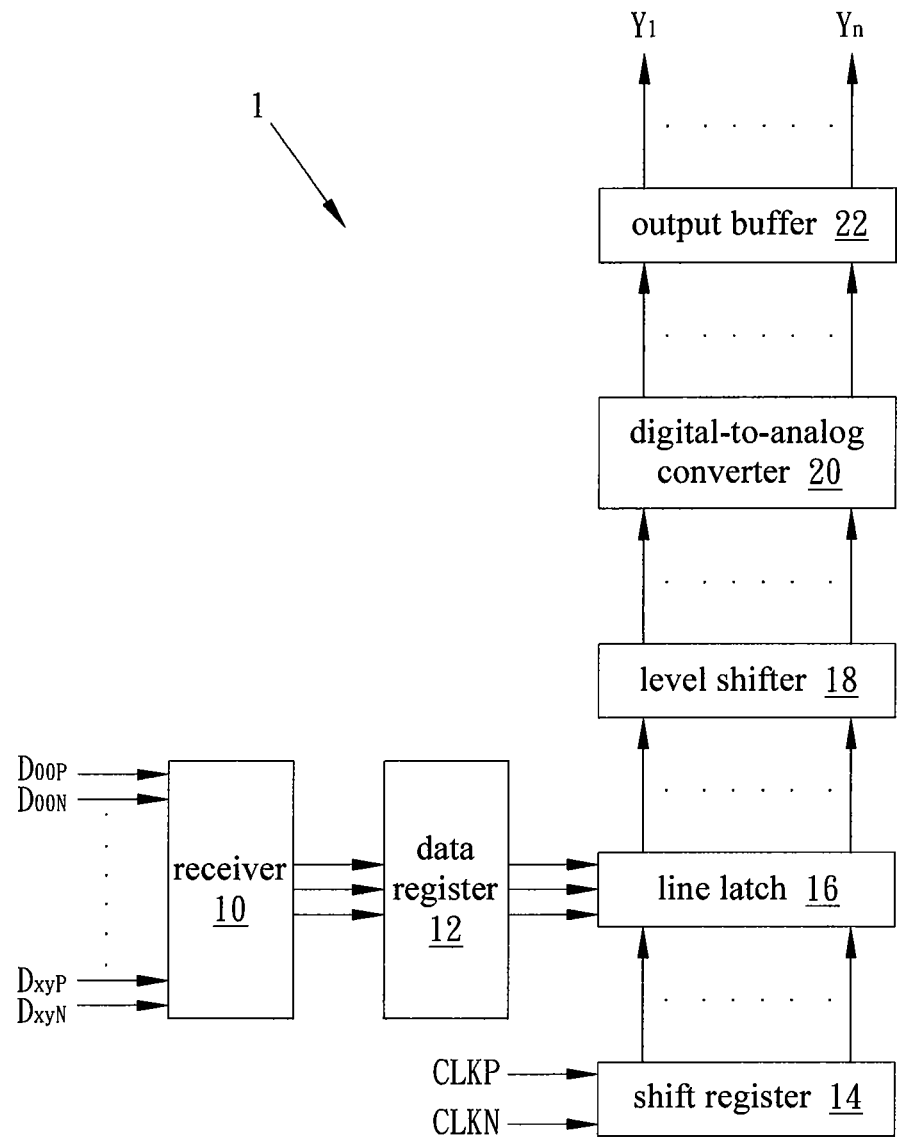
FIG. 1 illustrates a schematic diagram of a circuit structure of a conventional source driver.
Figure 2:
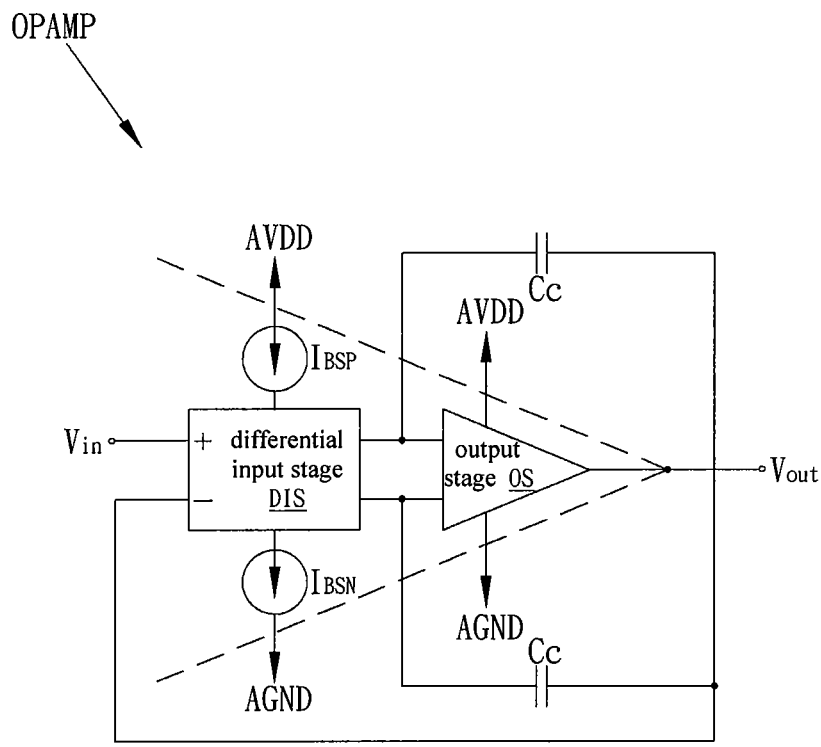
FIG. 2 illustrates a circuit diagram of a conventional operational amplifier used as the output buffer.

In this embodiment, the circuit structure of the source driver of the TFT-LCD display can be also referred in FIG. 1. As shown in FIG. 1, the source driver 1 includes a receiver 10, a data register 12, a bi-directional shift register 14, a line latch 16, a level shifter 18, a digital-to-analog converter 20, and an output buffer 22. Wherein, the receiver 10 is coupled to the data register 12; the data register 12 is coupled to the line latch 16; the bi-directional shift register 14 is coupled to the line latch 16; the line latch 16 is coupled to the level shifter 18; the level shifter 18 is coupled to the digital-to-analog converter 20; the digital-to-analog converter 20 is coupled to the output buffer 22.

It should be noticed that the main power domain of the source driver 1 includes digital power sources VDD, VSS and analog power sources AVDD, AGND. Wherein, AVDD represents the analog supply voltage; AGND represents the ground voltage.

Since the operations and functions of the receiver 10, the data register 12, the bi-directional shift register 14, the line latch 16, the level shifter 18, and the digital-to-analog converter 20 are the same with those in prior arts, and they will not be described again here. Next, the most important technology feature of the invention, the output buffer 22 of the source driver 1, will be introduced in detail as follows.

Figure 3:
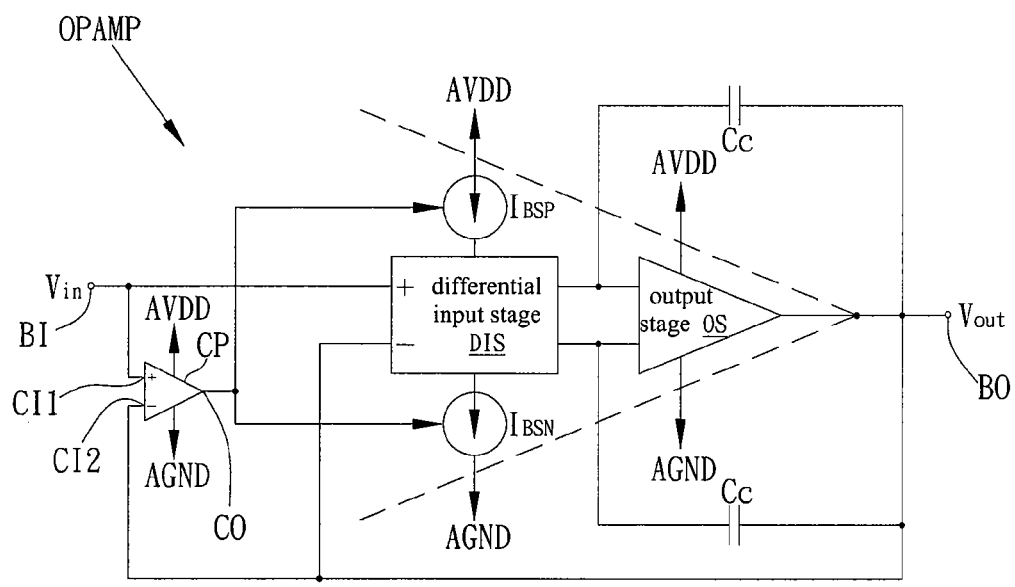
FIG. 3 illustrates a circuit diagram of an operational amplifier used as the output buffer in an embodiment of the invention.

In this embodiment, the output buffer 22 of the source driver 1 can be realized by an operational amplifier (OPAMP), but not limited to this. Please refer to FIG. 3. FIG. 3 illustrates a circuit diagram of the operational amplifier OPAMP used as the output buffer 22. As shown in FIG. 3, the circuit of the operational amplifier OPAMP includes a buffer input BI, a buffer output BO, a differential input stage DIS, a P-type bias current source $I_{BSP}$, a N-type bias current source $I_{BSN}$, an output stage OS, two compensation capacitors $C_c$, and a comparator CP.

Wherein, the differential input stage DIS is coupled to the buffer input BI and the buffer output BO; the P-type bias current source $I_{BSP}$ and the N-type bias current source $I_{BSN}$ are both coupled to the differential input stage DIS; the output stage OS is coupled between the differential input stage DIS and the buffer output BO; one end of the compensation capacitor $C_c$ is coupled between the differential input stage DIS and the output stage OS, and the other end of the compensation capacitor $C_c$ is coupled between the output stage OS and the buffer output BO; two comparator inputs CI1 and CI2 of the comparator CP are coupled to the buffer input BI and the buffer output BO respectively, and a comparator output CO of the comparator CP is coupled to the P-type bias current source $I_{BSP}$ and the N-type bias current source $I_{BSN}$.

In this embodiment, the P-type bias current source $I_{BSP}$ is coupled between the differential input stage DIS and the analog supply voltage AVDD in series, and the current output by the P-type bias current source $I_{BSP}$ flows toward the differential input stage DIS; the N-type bias current source $I_{BSN}$ is coupled between the differential input stage DIS and the ground voltage AGND in series, and the current output by the N-type bias current source $I_{BSN}$ flows toward the ground voltage AGND. The buffer input BI is used to receive an input voltage $V_{in}$ and transmits the input voltage $V_{in}$ to a positive input of the differential input stage DIS. After the differential input stage DIS processes the input voltage $V_{in}$, the differential input stage DIS will transmit the processed signal to the output stage OS. After the output stage OS converts the processed signal into an output voltage $V_{out}$, the buffer output BO will output the output voltage $V_{out}$.

The two comparator inputs CI1 and CI2 of the comparator CP are coupled to the buffer input BI and the buffer output BO respectively, therefore, the comparator CP can compare the input voltage $V_{in}$ with the output voltage $V_{out}$, and selectively output the P-type control signal to the P-type bias current source $I_{BSP}$ through the comparator output CO according to the compared result to control the P-type bias current outputted by the P-type bias current source $I_{BSP}$, or output the N-type control signal to the N-type bias current source $I_{BSN}$ to control the N-type bias current outputted by the N-type bias current source $I_{BSN}$.

Figure 4:
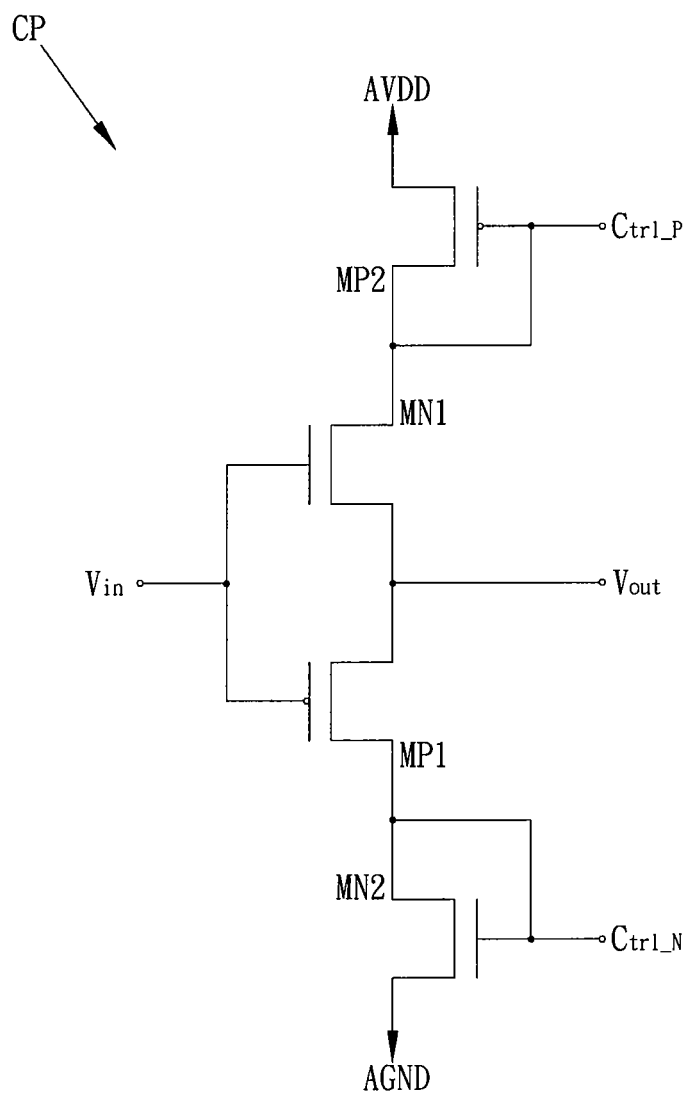
FIG. 4 illustrates a circuit diagram of an embodiment of the comparator in FIG. 3.

Then, Please refer to FIG. 4. FIG. 4 illustrates a circuit diagram of an embodiment of the comparator CP in FIG. 3. As shown in FIG. 4, the comparator CP is realized by a cascading source follower, but not limited to this. In this embodiment, the comparator CP includes not only the two comparator inputs CI1, CI2, and the comparator output CO, but also a first N-type transistor MN1, a second N-type transistor MN2, a first P-type transistor MP1, and a second P-type transistor MP2. In fact, the first N-type transistor MN1 and the second N-type transistor MN2 can be NMOS transistors, and the first P-type transistor MP1 and the second P-type transistor MP2 can be PMOS transistors, but not limited to this.

Wherein, the first N-type transistor MN1 is coupled to the buffer input BI, the buffer output BO, and the comparator output CO; the second N-type transistor MN2 is coupled to the ground voltage AGND and the comparator output CO; the first P-type transistor MP1 is coupled between the first N-type transistor MN1 and the second N-type transistor MN2, and coupled to the buffer input BI, the buffer output BO, and the comparator output CO; the second P-type transistor MP2 is coupled between the first N-type transistor MN1 and the analog supply voltage (AVDD), and coupled to the comparator output CO.

Then, the two compared results of the input voltage $V_{in}$ and the output voltage $V_{out}$ will be introduced as follows.

If the input voltage $V_{in}$ is larger than the output voltage $V_{out}$, the comparator CP will output the P-type control signal Ctrl_P to the P-type bias current source $I_{BSP}$ through its comparator output CO to control the P-type bias current outputted by the P-type bias current source $I_{BSP}$. In fact, the driving slew rate of the operational amplifier OPAMP (namely the output buffer 22) is determined by the P-type bias current source $I_{BSP}$/the compensation capacitor $C_c$. Therefore, when the input voltage $V_{in}$ is larger than the output voltage $V_{out}$, the P-type bias current source $I_{BSP}$ increases the P-type bias current according to the P-type control signal Ctrl_P to enhance the driving slew rate of the operational amplifier OPAMP.

If the output voltage $V_{out}$ is larger than the input voltage $V_{in}$, the comparator CP will output the N-type control signal Ctrl_N to the N-type bias current source $I_{BSN}$ through its comparator output CO to control the N-type bias current outputted by the N-type bias current source $I_{BSN}$. In fact, the sinking slew rate of the operational amplifier OPAMP (namely the output buffer 22) is determined by the N-type bias current source $I_{BSN}$/the compensation capacitor $C_c$. Therefore, when the input voltage $V_{in}$ is larger than the output voltage $V_{out}$, the N-type bias current source $I_{BSN}$ increases the N-type bias current according to the N-type control signal Ctrl_N to enhance the sinking slew rate of the operational amplifier OPAMP.

Above all, no matter under the condition that the input voltage $V_{in}$ is larger than the output voltage $V_{out}$ or the output voltage $V_{out}$ is larger than the input voltage $V_{in}$, the driving slew rate or the sinking slew rate of the output buffer 22 (the operational amplifier OPAMP) can be both enhanced. Compared with the prior arts, the output buffer applied in a source driver of a liquid crystal display of the invention can use the way of changing the input voltage to effectively increase the slew rate of the output buffer and solve the problems of large power consumption and poor stability in prior arts; therefore, the entire performance of the TFT-LCD can be enhanced.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An output buffer, applied in a source driver of a liquid crystal display, the output buffer comprising:
    a buffer input, for receiving an input voltage;
    a buffer output, for outputting an output voltage;
    a differential input stage, coupled to the buffer input and the buffer output;
    a bias current source, coupled to the differential input stage;
    an output stage, coupled between the differential input stage and the buffer output, the output stage being operated between an analog supply voltage (AVDD) and a ground voltage (AGND);
    a compensation capacitor, having one end coupled between the differential input stage and the output stage and the other end coupled between the output stage and the buffer output; and
    a comparator, operated between the analog supply voltage (AVDD) and the ground voltage (AGND), two comparator inputs of the comparator being coupled to the buffer input and the buffer output respectively, a comparator output of the comparator being coupled to the bias current source, the comparator comparing the input voltage with the output voltage and outputting a control signal to the bias current source according to the compared result to control a bias current outputted by the bias current source;
    wherein the bias current source comprises a P-type bias current source and a N-type bias current source, the P-type bias current source is coupled between the analog supply voltage (AVDD) and the differential input stage, the N-type bias current source is coupled between the differential input stage and the ground voltage (AGND), the comparator output of the comparator is coupled to the P-type bias current source and the N-type bias current source.

2. The output buffer of claim 1, wherein the comparator further comprises:
   a first N-type transistor, coupled to the buffer input, the buffer output, and the comparator output;
   a second N-type transistor, coupled to the ground voltage (AGND) and the comparator output;
   a first P-type transistor, coupled between the first N-type transistor and the second N-type transistor, and coupled to the buffer input, the buffer output, and the comparator output; and
   a second P-type transistor, coupled between the first N-type transistor and the analog supply voltage (AVDD), and coupled to the comparator output.

3. The output buffer of claim 2, wherein if the input voltage is larger than the output voltage, the control signal outputted by the comparator output to the P-type bias current source is a P-type control signal to control a P-type bias current outputted by the P-type bias current source.

4. The output buffer of claim 3, wherein the P-type bias current source increases the P-type bias current according to the P-type control signal to enhance a driving slew rate of the output buffer, and the driving slew rate is determined by the P-type bias current/the compensation capacitor.

5. The output buffer of claim 3, wherein the P-type bias current outputted by the P-type bias current source flows toward the differential input stage.

6. The output buffer of claim 2, wherein if the output voltage is larger than the input voltage, the control signal outputted by the comparator output to the N-type bias current source is a N-type control signal to control a N-type bias current outputted by the N-type bias current source.

7. The output buffer of claim 6, wherein the N-type bias current source increases the N-type bias current according to the N-type control signal to enhance a sinking slew rate of the output buffer, and the sinking slew rate is determined by the N-type bias current/the compensation capacitor.

8. The output buffer of claim 6, wherein the N-type bias current outputted by the N-type bias current source flows toward the ground voltage (AGND).

9. The output buffer of claim 1, wherein the differential input stage comprises a positive input and a negative input, the positive input and the negative input are coupled to the buffer input and the buffer output respectively, and used to receive the input voltage and the output voltage.

* * * * *